United States Patent
Fung et al.

(10) Patent No.: US 10,707,331 B2
(45) Date of Patent: Jul. 7, 2020

(54) FINFET DEVICE WITH A REDUCED WIDTH

(71) Applicant: Taiwan Semiconductor Manufacturing Company, Ltd., Hsinchu (TW)

(72) Inventors: Ka-Hing Fung, Zhudong Township (TW); Chen-Yu Hsieh, Hsinchu (TW); Che-Yuan Hsu, Hsinchu (TW); Ming-Yuan Wu, Hsinchu (TW); Hsu-Chieh Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/581,206

(22) Filed: Apr. 28, 2017

(65) Prior Publication Data

US 2018/0315837 A1 Nov. 1, 2018

(51) Int. Cl.
| | |
|---|---|
| H01L 29/66 | (2006.01) |
| H01L 21/66 | (2006.01) |
| H01L 29/78 | (2006.01) |
| H01L 27/088 | (2006.01) |
| H01L 21/8234 | (2006.01) |

(52) U.S. Cl.
CPC .......... *H01L 29/66795* (2013.01); *H01L 21/823431* (2013.01); *H01L 22/20* (2013.01); *H01L 27/0886* (2013.01); *H01L 29/66545* (2013.01); *H01L 29/66818* (2013.01); *H01L 29/785* (2013.01); *H01L 29/7851* (2013.01); *H01L 22/12* (2013.01); *H01L 29/7848* (2013.01)

(58) Field of Classification Search
CPC ............ H01L 29/66795; H01L 29/785; H01L 29/66545; H01L 29/6681; H01L 21/823431; H01L 21/823821
See application file for complete search history.

(56) References Cited

U.S. PATENT DOCUMENTS

| | | | |
|---|---|---|---|
| 6,764,884 B1 | 7/2004 | Yu et al. | |
| 6,967,175 B1 * | 11/2005 | Ahmed | H01L 29/66545 257/E21.444 |
| 7,394,116 B2 * | 7/2008 | Kim | H01L 21/84 257/213 |
| 7,745,871 B2 * | 6/2010 | Oh | H01L 29/66553 257/314 |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,087,687 B2 * | 7/2015 | Adam | H01L 21/823807 |

(Continued)

FOREIGN PATENT DOCUMENTS

| | | | | |
|---|---|---|---|---|
| KR | 10-2004-0111072 | * | 12/2004 | ............ H01L 21/66 |
| KR | 20040111072 A | | 12/2004 | |

(Continued)

*Primary Examiner* — Khiem D Nguyen
(74) *Attorney, Agent, or Firm* — Haynes and Boone, LLP (57) ABSTRACT

A method includes forming a fin structure on a substrate, forming a dummy gate structure wrapped around the fin structure, depositing an Interlayer Dielectric (ILD) layer over the fin structure, removing the dummy gate structure to expose a portion of the fin structure, and performing an etching process on the portion of the fin structure to reduce a width of the portion of the fin structure.

20 Claims, 10 Drawing Sheets

(56) References Cited

U.S. PATENT DOCUMENTS

| | | | |
|---|---|---|---|
| 9,087,844 B2* | 7/2015 | Kim | H01L 23/528 |
| 9,530,699 B2* | 12/2016 | Kerber | H01L 21/823821 |
| 2004/0200574 A1* | 10/2004 | Davis | G05B 19/41875 |
| | | | 156/345.1 |
| 2005/0272192 A1* | 12/2005 | Oh | H01L 29/66553 |
| | | | 438/197 |
| 2008/0054349 A1* | 3/2008 | Cheng | H01L 21/823418 |
| | | | 257/329 |
| 2009/0206374 A1* | 8/2009 | Anderson | H01L 29/66795 |
| | | | 257/270 |
| 2013/0302975 A1 | 11/2013 | Chang et al. | |
| 2013/0313610 A1* | 11/2013 | Sell | H01L 21/02532 |
| | | | 257/192 |
| 2014/0077332 A1* | 3/2014 | Vincent | H01L 29/7856 |
| | | | 257/506 |
| 2014/0282326 A1 | 9/2014 | Chen et al. | |
| 2014/0353735 A1* | 12/2014 | Basker | H01L 29/66795 |
| | | | 257/288 |
| 2015/0132911 A1* | 5/2015 | Wann | H01L 21/823821 |
| | | | 438/283 |
| 2015/0235905 A1* | 8/2015 | Liaw | H01L 21/823821 |
| | | | 438/283 |
| 2015/0364595 A1 | 12/2015 | Liu et al. | |
| 2016/0027775 A1 | 1/2016 | Akarvardar et al. | |
| 2016/0111553 A1 | 4/2016 | Basker et al. | |
| 2016/0276345 A1 | 9/2016 | Yu et al. | |
| 2017/0005090 A1* | 1/2017 | Ando | H01L 27/0886 |
| 2017/0033201 A1 | 2/2017 | Basker et al. | |
| 2017/0110476 A1 | 4/2017 | Ching et al. | |

FOREIGN PATENT DOCUMENTS

| | | | | |
|---|---|---|---|---|
| KR | 10-2005-0119679 | * | 12/2005 | H01L 21/336 |
| KR | 101079348 B1 | | 11/2011 | |

* cited by examiner

FINFET DEVICE WITH A REDUCED WIDTH

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One type of semiconductor device that can be fabricated is a Fin Field Effect Transistor (FinFET). In a FinFET, a fin-shaped semiconductor structure is formed on a substrate. A gate device that wraps around the fin structure can then be formed. Additionally, active regions such as source/drain regions are then formed within the fin structure adjacent the gate structure. The gate device and adjacent source/drain regions thus form a transistor with the channel extending through the fin structure underneath the gate. It is desirable that the fin structure has characteristics that provide it with sufficient mechanical strength as well as good carrier mobility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable that the fin structure has characteristics that provide it with sufficient mechanical strength as well as good carrier mobility. In general, a smaller fin width may be subject to more structural weakness, and may thus be prone to breaking, deforming, or collapsing. However, a smaller fin width also provides a shorter channel. A shorter channel can lead to improved device performance. Accordingly, it is desirable to have a fin structure that provides a short channel but has sufficient width to provide the desired structural support.

According to one example of principles described herein, a FinFET device has a reduced width in the portion that is covered by the gate structure. This reduced width improves the performance of the FinFET. Additionally, the portions of the fin not covered by the gate structure may have a larger width, thus providing the desired structural support. In some examples, fabricating such a device includes forming a dummy gate structure around the fin structure, depositing an Interlayer Dielectric (ILD), and removing the dummy gate structure. After removing the dummy gate structure, the portion of the fin over which the replacement metal gate structure will be placed is exposed. Thus, an etching process may be applied to reduce the width of the fin structure at the exposed portion. The other portions of the fin structure are covered by the ILD and are thus not affected by the etching process. After the etching process, the replacement gate can be formed. Using this technique, a fin structure may be wide enough to provide the desired structural strength, well-being narrow enough and channel regions so as to provide improved performance of transistor devices.

Figure 1A:
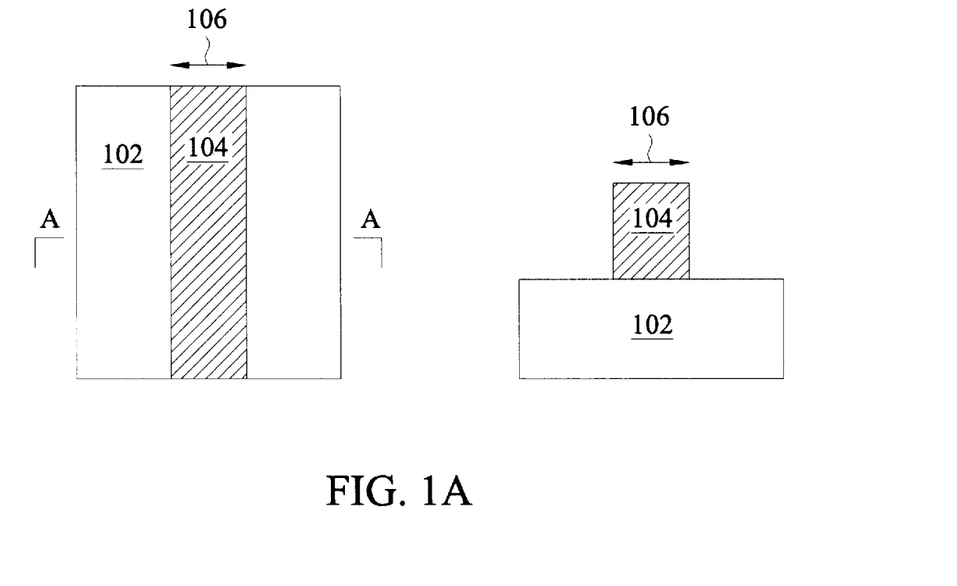
FIGS. 1A, 1B, 1C, 1D, 1E, and 1F are diagrams showing an illustrative process for forming a FinFET device with a reduced width, according to one example of principles described herein.

FIGS. 1A, 1B, 1C, 1D, 1E, and 1F are diagrams showing an illustrative process for forming a FinFET device with a reduced width. FIG. 1A illustrates a fin structure 104 disposed on the substrate 102. The fin structure has a first width 106. The left side of FIG. 1A illustrates a top view of the fin structure 104. The right side of FIG. 1A illustrates a cross-sectional view of the fin structure 104 corresponding to cross-section A as illustrated in the top view.

The substrate 102 may be a semiconductor wafer comprising silicon. The semiconductor wafer may be a standard wafer used in semiconductor fabrication processes. For example, the semiconductor wafer may be a round wafer having a diameter of about 300 millimeters. In one example, the substrate 102 includes silicon in a crystalline structure. In some examples, the substrate 102 includes other elementary semiconductors such as germanium, or a compound semiconductor such as silicon carbide, gallium arsenide, indium arsenide, and indium phosphide. The substrate 102 may include one or more layers of material or composition. The substrate 102 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers.

The fin structure 104 may be fabricated in a variety of manners. In one example, the fin structure 104 may be fabricated by patterning the substrate 102. For example, the fin structure 104 on the substrate 102 may be made of the same originally deposited layer or wafer. Through photolithographic processes, the substrate 102 may be etched to remove material at regions not corresponding to the fin structure 104. In some examples, the fin structure 104 may be fabricated by epitaxially growing a semiconductor layer on the substrate 102. An epitaxial growth process is one in which semiconductor material is provided through a carrier gas and is deposited into a crystal structure onto the underlying crystal substrate. After the epitaxially grown semiconductor layer is formed on the substrate 102, a patterning process, such as a photolithographic process, may be applied to that layer to form the fin structure 104. In some examples, the fin structure 104 is doped based on the type of transistor to be formed. For example, for PMOS transistors, the fin structure 104 may be doped with an n-type dopant such as arsenic. For NMOS transistors, the fin structure 104 may be doped with the p-type dopant such as boron. The fin structure 104 may be doped in situ or after its formation.

Figure 1B:
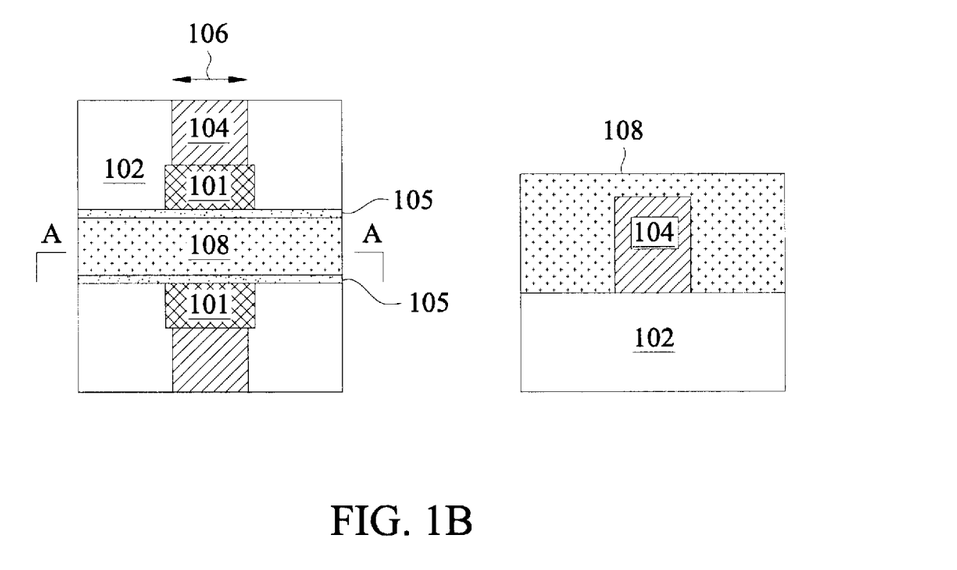

FIG. 1B illustrates formation of a gate structure 108 and source/drain regions 101. The gate structure may be a dummy gate structure 108. The dummy gate structure 108 may be made of a conductive material such as polysilicon. The dummy gate structure 108 is a temporary structure that is eventually replaced with a metal gate structure. In some examples, the dummy gate structure 108 may be formed using photolithographic processes. For example, a polysilicon layer may be deposited over the fin structure 104. Then, a photoresist may be deposited over the polysilicon layer. The photoresist may be exposed to a light source through a mask and then developed such that photoresist remains over the regions where fin structures are to be formed. Then, an etching process may be applied to remove polysilicon material not covered by the photoresist. The dummy gate structure 108 may have gate spacers 105 formed on both sides.

After the dummy gate structure 108 is formed, source/drain regions 101 may be formed adjacent the gate structure. The source/drain regions 101 may be formed in a variety of manners. In some examples, a lightly doped drain (LDD) region may be formed adjacent the dummy gate structure. In some examples, a portion of the fin structure may be removed and replaced with an epitaxially grown source/drain region. The source/drain regions 101 may be doped with a particular type of dopant based on the type of transistor being formed. For example, for PMOS transistors the source/drain regions 101 may be doped with p-type dopants. For NMOS transistors, the source/drain regions 101 may be doped with n-type dopants.

In some examples, the source/drain regions 101 may be formed by etching portions of the fin structure 104 to create cavities within the fin structure 104. The etching process may be designed so as to create the cavities a specific depth within the fin structure 104. After the cavity is formed, an epitaxial growth process may be applied to epitaxially grow the source/drain regions 101 within the cavities. The source/drain regions 101 may also be doped in situ. In other words, the source/drain regions 101 may be implanted with the desired dopant species while the source/drain regions 101 are being formed. The source/drain regions 101 may include the same type of semiconductor material (e.g., silicon) as the fin structure 104. In some examples, however, the source/drain regions 101 may include a compound semiconductor such as silicon germanium.

Figure 1C:
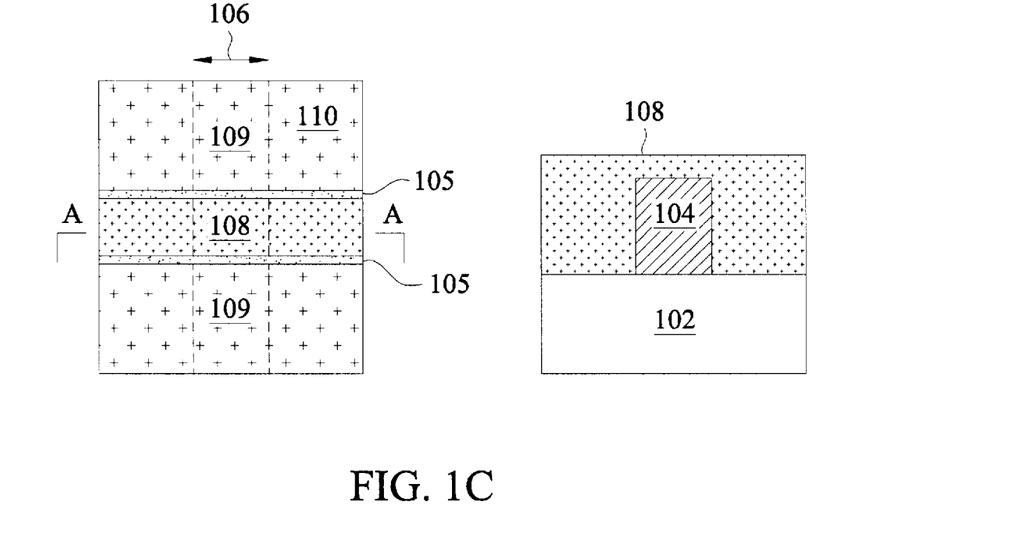

FIG. 1C illustrates formation of an ILD layer 110 over the fin structure 104 and over the dummy gate structure 108. In some examples, the ILD layer 110 is formed by depositing a dielectric material, such as silicon dioxide (SiO2). Then, a Chemical Mechanical Polishing (CMP) process is applied to expose the top surface of the dummy gate structure 108. A CMP process includes a mechanical component and a chemical component. The mechanical component involves abrasive particles and the chemical component involves a chemical etchant. In some examples, the top surface of the dummy gate structure 108 may include a polish-stop layer. Such a polish-stop layer is resistant to CMP processing and thus application of CMP processes occurs until the polish-stop layer is reached. As illustrated in the top view, the portions 109 of the fin structure that are not covered by the dummy gate structure 108 remain covered by the ILD layer 110.

Figure 1D:
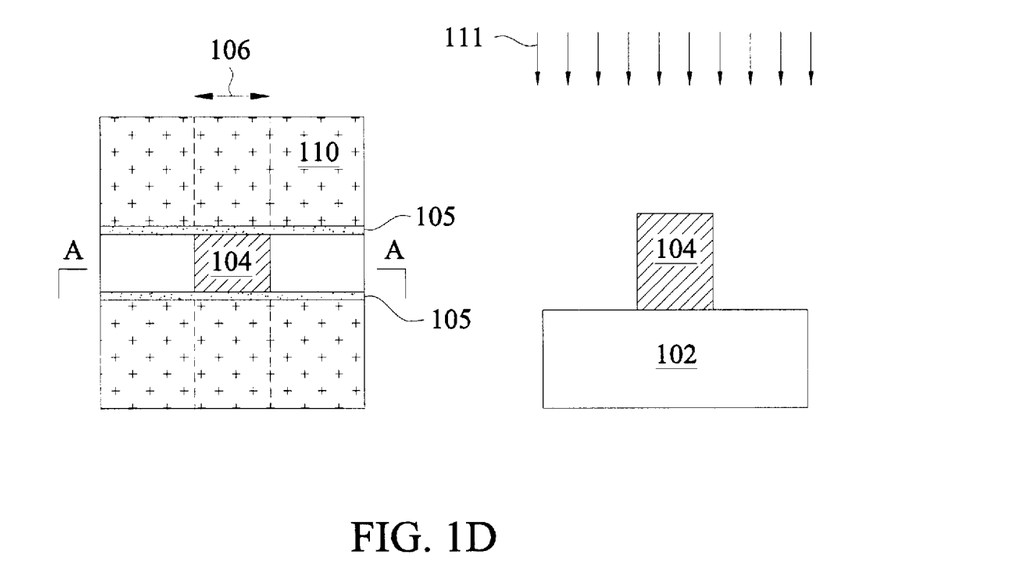

FIG. 1D illustrates removal of the dummy gate structure 108. The removal process leaves a trench 115 within the ILD layer 110. The trench exposes the fin structure 104. As described above, the dummy gate structure 108 is a temporary structure that is replaced with a metal gate structure. In some examples, the dummy gate structure 108 is removed using an etching process. The etching process may be an anisotropic process such as a dry etching process. A dry etching process involves directing ions at a substrate to remove material from that substrate. A dry etching process can be selective so as to remove some type of materials while leaving other types of materials substantially intact. For example, an etching process may be selective so as to remove the material of the dummy gate structure 108 while leaving the material of the ILD 110 substantially intact. For example, an etching process may be designed to remove polysilicon while leaving silicon dioxide substantially intact. After the etching process 111 is finished, the side surfaces as well as the top surface of the fin structure 104 may be exposed.

Figure 1E:
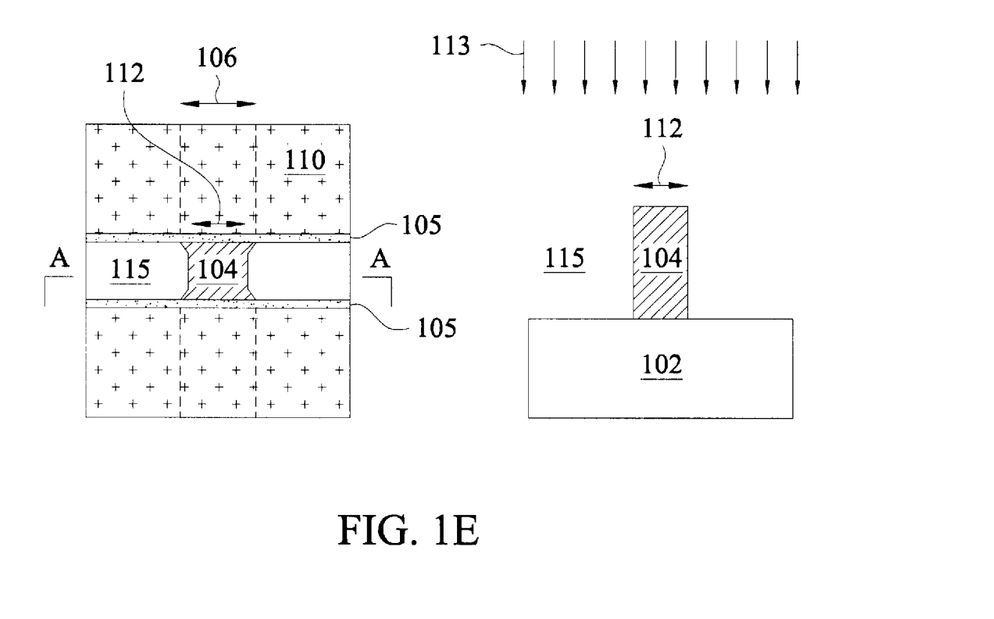

FIG. 1E illustrates an etching process to reduce, or trim, the width of the fin structure 104. Specifically, the etching process 113 reduces the width of the fin structure from the first width 106 to a second width 112. In some examples, the second width 112 is within a range of about 0-10 nanometers smaller than the first width 106. For example, the etching process 113 may remove about 0-5 nanometers from each side of the fin structure 104. In the present example, the etching process 113 does not reduce the width of the fin structure 104 underneath the gate spacers 105.

In some examples, the etching process 113 may be performed in response to certain conditions. For example, after the dummy gate structure 108 is formed, the width of the dummy gate structure 108 may be measured. If the width of the dummy gate structure is below a predetermined threshold width value, then it may be determined that the etching process 113 should not be performed. If, however, the measured width of the dummy gate structure 108 is greater than the predetermined threshold width value, then the etching process 113 may be applied to reduce the predetermined threshold width value.

In some examples, the etching process 113 may be configured to reduce the width of the fin structure to a width value that is less than the predetermined threshold width value. In some examples, the width value may be a predetermined value. For example, the predetermined width value may be 10 nanometers. If the predetermined threshold width value is 12 nanometers, and the measured width is 20 nanometers, then the etching process 113 may be applied to reduce the width of the fin structure by about 10 nanometers to reduce the width of the fin structure to the predetermined width value of 10 nanometers. In another example, if the measured width is 15 nanometers, then the etching process 113 may be configured to reduce the width of the fin structure 104 by about 5 nanometers to a predetermined width of about 10 nanometers.

The etching process 113 may be an isotropic etching process such as a wet etching process. In some examples, the etching process 113 may be configured or tuned to reduce the width by the desired amount. For example, if it is determined that the width should be reduced by 5 nanometers, then the parameters of the etching process 113, such as the period of time for which it is applied, may be set accordingly. If it is determined that the width should be reduced by 10 nanometers, then the parameters of the etching process are also adjusted and configured accordingly.

Figure 1F:
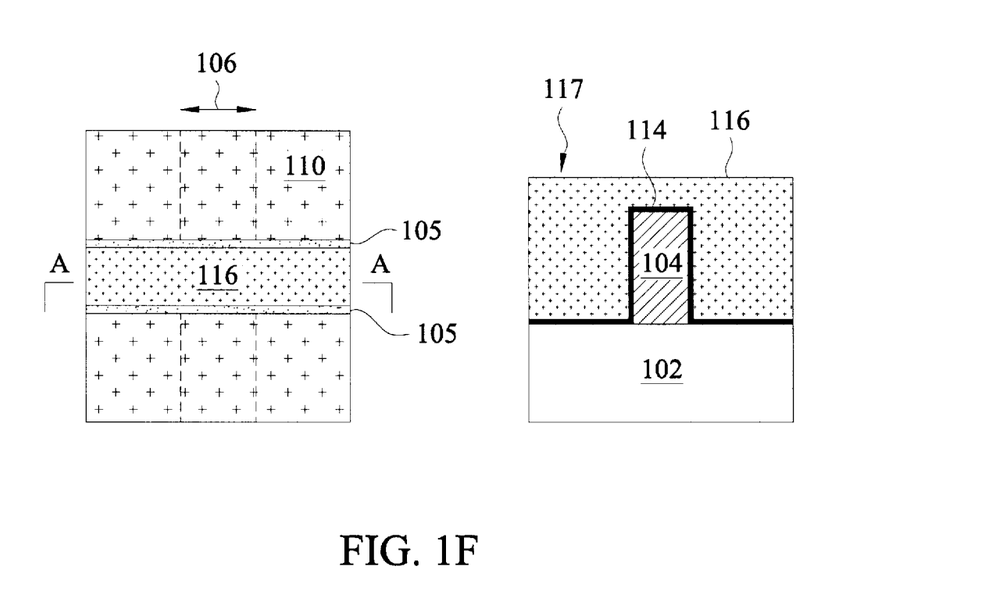

FIG. 1F illustrates formation of a replacement metal gate 117. The replacement metal gate 117 is formed within the trench 115 that was formed by the etching process 111 to remove the dummy gate structure 108. The replacement metal gate 117 may include several layers. In the present example, the replacement metal gate 117 includes a gate dielectric layer 114 and a metal layer 116.

The gate dielectric layer 114 is used to separate the metal layer 116 from the channel. The channel is the part of the fin structure extending between the source/drain regions 101. In some examples, the gate dielectric layer 114 may be formed by oxidizing the semiconductor material of the fin structure 104. For example, if the fin structure 104 is made of silicon, then an oxidizing process can be used to form a silicon dioxide layer around the fin structure 104 and on the underlying substrate 102. The silicon dioxide may have a thickness within a range of 5-100 nanometers.

The metal layer 116 provides the conductive properties for the gate structure of the transistor. The metal layer 116 may include a variety of different sub-layers made from different materials. For example, the metal layer 116 may include various layers made from different materials such as aluminum, tantalum, tungsten, and other appropriate conductive materials. The metal layer 116 may be designed to provide the desired performance characteristics of the transistor device to which the gate structure belongs.

Using the process illustrated in FIGS. 1A-1F, a fin structure with a reduced width where the gate structures are located may be formed. The regions not corresponding to the gate structure may have a greater width and provide greater mechanical stability. Additionally, the smaller width at the portion of the fin structure 104 underneath the gate structure has a reduced width so as to provide better device performance. Additionally, while only a single transistor is illustrated in relation to the fin structure 104, it may be the case that multiple transistors are formed within the fin structure 104.

The semiconductor device illustrated in FIGS. 1A-1F are illustrated in a manner so as to convey the principles described herein, and do not necessarily represent the geometry and dimensions of a real semiconductor device that is fabricated using such principles. For example, while the fin structures are illustrated as substantially rectangular, it is understood by one of ordinary skill in the art that real fin structures may not necessarily be perfectly rectangular. For example, real fin structures may include rounded corners and slightly non-linear surfaces. Additionally, real fin structures may taper towards a top side of the fin structure.

Figure 2:
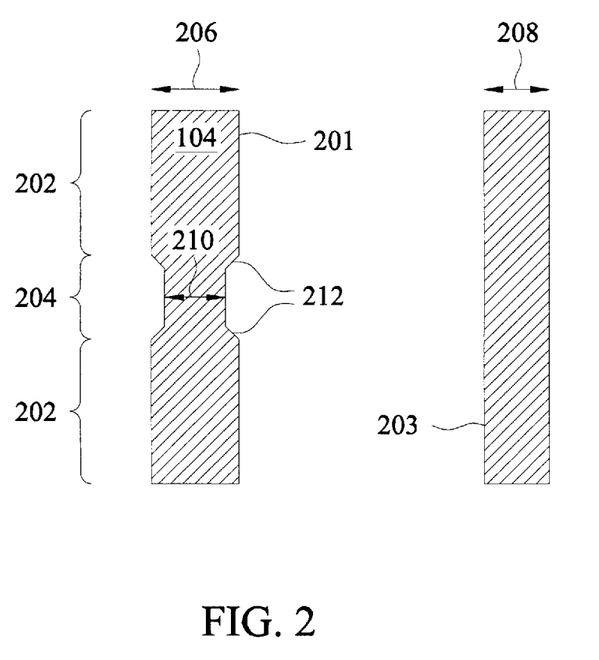
FIG. 2 is a diagram showing various characteristics of FinFET device with a reduced width, according to one example of principles described herein.

FIG. 2 is a diagram showing various characteristics of FinFET device with a reduced width. Specifically, FIG. 2 illustrates two different fin structures 201, 203. The first fin structure 201, when originally formed, has a width 206 that is greater that a predetermined threshold width value. Thus, it is determined that the portion 204 where the gate structure overlaps will be reduced to a smaller width 210 using the fabrication processes described above. The portions 202 not covered by a gate structure remain the original width 206.

In some examples, the width gradually changes in the regions 212 near the transistor between portions 202 and 204. Specifically the width increases in the region 212 extending from portion 204 to portions 202. For example, after the trimming etching process 113 described above, a width between the exposed portion of the fin structure and an unexposed portion of fin structure gradually changes.

As described above, in some examples, the trimming etching process 113 is performed in response to determining that the measured width of the fin structure is greater than a predetermined threshold width value. Thus, if the measured width of the fin structure is less than the predetermined threshold width value, then the trimming etching process 113 may not be applied. Fin structure 203 is an example of such a scenario. The original width 208 of the fin structure 203 is less than the predetermined threshold width value, and thus no trimming process is applied. In some examples, the original width 208 of fin structure 203 may be similar to the reduced width 210 of fin structure 201.

Figure 3:
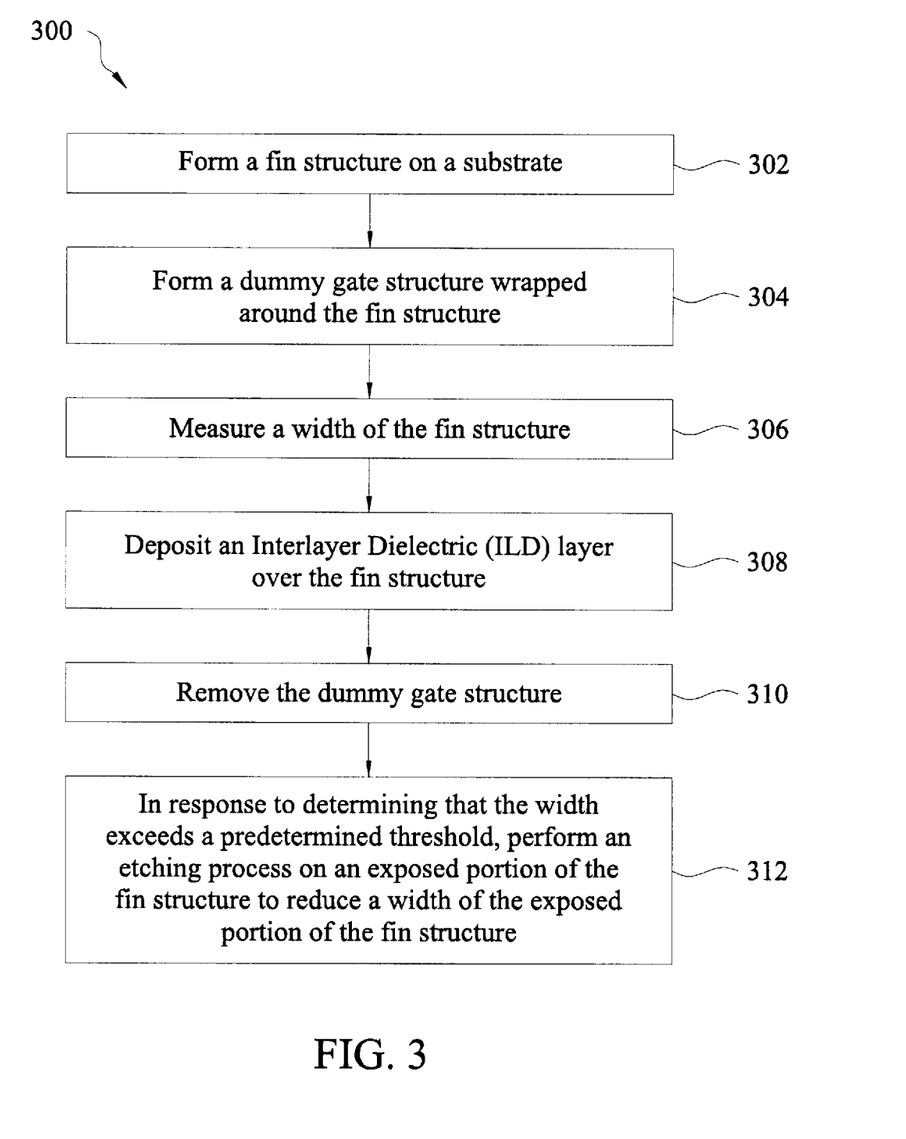
FIG. 3 is a flowchart showing an illustrative method for forming a FinFET device with a reduced width, according to one example of principles described herein.

FIG. 3 is a flowchart showing an illustrative method for forming a FinFET device with a reduced width. According to the present example, the method 300 includes a process 302 for forming a fin structure on a substrate. The fin structure may be fabricated in a variety of manners. In one example, the fin structure may be fabricated by patterning the substrate. For example, the fin structure on the substrate may be made of the same originally deposited layer or wafer. Through photolithographic processes, the substrate may be etched to remove material at regions not corresponding to the fin structure. In some examples, the fin structure may be fabricated by epitaxially growing a semiconductor layer on the substrate. After the epitaxially grown semiconductor layer is formed on the substrate, a patterning process, such as a photolithographic process, may be applied to that layer to form the fin structure. In some examples, the fin structure is doped based on the type of transistor to be formed. For example, for PMOS transistors, the fin structure may be doped with an n-type dopant. For NMOS transistors, the fin structure may be doped with the p-type dopant. The fin structure may be doped in situ or after its formation.

According to the present example, the method 300 further includes a process 304 for forming a dummy gate structure wrapped around the fin structure. The dummy gate structure may be made of a conductive material such as polysilicon.

The dummy gate structure is a temporary structure that is eventually replaced with a metal gate structure. In some examples, the dummy gate structure may be formed using photolithographic processes. For example, a polysilicon layer may be deposited over the fin structure. Then, a photoresist may be deposited over the polysilicon layer. The photoresist may be exposed to a light source through a mask and then developed such that photoresist remains over the regions where fin structures are to be formed. Then, an etching process may be applied to remove polysilicon material not covered by the photoresist.

According to the present example, the method 300 further includes a process 306 for measuring a width of the fin structure. This may be done with a variety of measurement tools. For example, a measuring process may be done using a scanning electron microscope (SEM) or through transmission electron microscopy (TEM). Other measurement techniques are contemplated as well.

According to the present example, the method 300 further includes a process 308 for depositing an Interlayer Dielectric (ILD) layer over the fin structure. In some examples, the ILD layer is formed by depositing a dielectric material, such as silicon dioxide. Then, a CMP process is applied to expose the top surface of the gate structure. In some examples, the top surface of the dummy gate structure may include a polish-stop layer. Such a polish-stop layer is resistant to CMP processing and thus application of CMP processes occurs until the polish-stop layer is reached. As illustrated in the top view, the portions of the fin structure that are not covered by the dummy gate structure remain covered by the ILD layer.

According to the present example, the method 300 includes a process 310 for removing the dummy gate structure. The removal process may leave a trench within the ILD layer. The trench exposes the fin structure. As described above, the dummy gate structure is a temporary structure that is replaced with a metal gate structure. In some examples, the dummy gate structure is removed using an etching process. The etching process may be an anisotropic process such as a dry etching process. The dry etching process can be selective so as to remove the material of the dummy gate structure while leaving the material of the ILD substantially intact. For example, an etching process may be designed to remove polysilicon while leaving silicon dioxide substantially intact. After the etching process is finished, the side surfaces as well as the top surface of the fin structure may be exposed.

According to the present example, the method 300 includes a process 312 for, in response to determining that the width exceeds a predetermined threshold width value, performing an etching process on an exposed portion of the fin structure to reduce a width of the exposed portion of the fin structure. As described above, the etching process may be performed in response to certain conditions, particularly, a determination that the width exceeds a predetermined threshold width value. For example, after the dummy gate structure is formed, the width of the dummy gate structure may be measured. If the width of the dummy gate structure is below a predetermined threshold width value, then it may be determined that the etching process should not be performed. If, however, the measured width of the dummy gate structure is greater than the predetermined threshold width value, then the etching process may be applied to reduce the width of the fin structure.

In some examples, the etching process may be configured to reduce the width of the fin structure to a reduced width that is less than the predetermined threshold width value. In some examples, the reduced width may be a predetermined value. For example, the predetermined reduced width may be 10 nanometers. If the predetermined threshold width value is 12 nanometers, and the measured width is 20 nanometers, then the etching process may be applied to reduce the width of the fin structure by about 10 nanometers to reduce the width of the fin structure to the predetermined reduced width of 10 nanometers. In another example, if the measured width is 15 nanometers, then the etching process may be configured to reduce the width of the fin structure by about 5 nanometers to a predetermined reduced width of about 10 nanometers.

Using the method described above, a fin structure with a reduced width where the gate structures are located may be formed. The regions not corresponding to the gate structure may have a greater width and provide greater mechanical stability. Additionally, the smaller width at the portion of the fin structure underneath the gate structure has a reduced width so as to provide better device performance. Additionally, while only a single transistor is illustrated in relation to the fin structure, it may be the case that multiple transistors are formed within the fin structure.

Additionally, use of principles described herein allows for a greater consistency in fin width from wafer to wafer. In other words, it allows for a narrower distribution of find widths over a set of fabricated wafers. This is beneficial because it allows the target fin width to be set lower than it otherwise might be.

Figure 4:
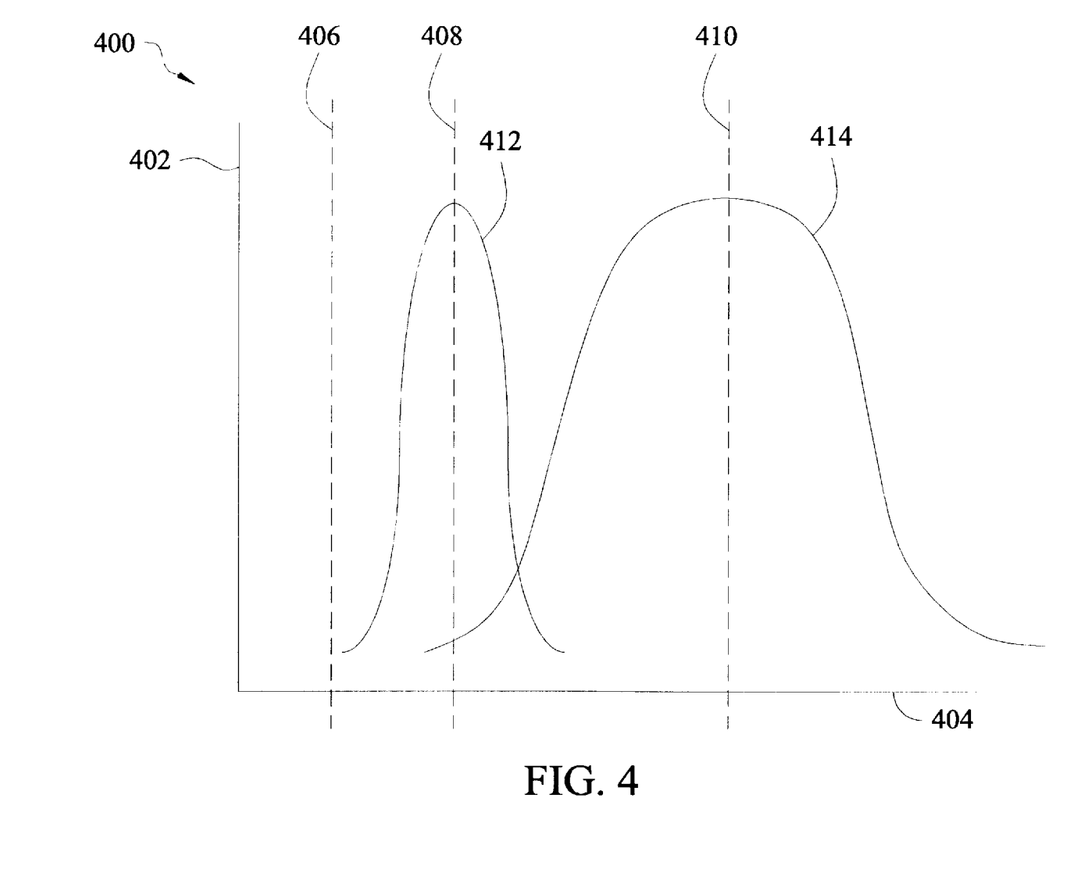
FIG. 4 is a graph showing distribution of fabricated fin widths, according to one example of principles described herein.

FIG. 4 is a graph 400 showing distribution of fabricated fin widths. According to the present example, the horizontal axis represents fin width and the vertical axis 402 represents the number of wafers at a particular fin width. The first dotted line represents the minimum fin width 406. In other words, line 406 represents a width at which if a fin is formed, it is has too high of a chance to be defective. The second dotted line represents the fin width target 408 when using principles described herein. The third dotted line represents the fin width target 410 without principles described herein. Without principles described herein, there is a wider distribution 414 of fin widths from the target. Various process inconsistencies lead to minor variations in the final width of the fin structure from wafer to wafer. For example, a target of 10 nanometers may result in fin structures ranging from 8.0 nanometers to 12.0 nanometers.

By using the fin trimming processes described above, the distribution 412 of fin widths is smaller. Thus, the target 408 can be set lower because the tighter distribution reduces the risk that there will be fin widths below the minimum fin width 406. For example, if the distribution range is +/−0.5 nanometers, and the minimum width is 7.0 nanometers, the target 408 may be set at 8 nanometers instead of 10. Smaller size features are more advantageous because more features can be fit on the chip and they may consume less power.

Figure 5A:
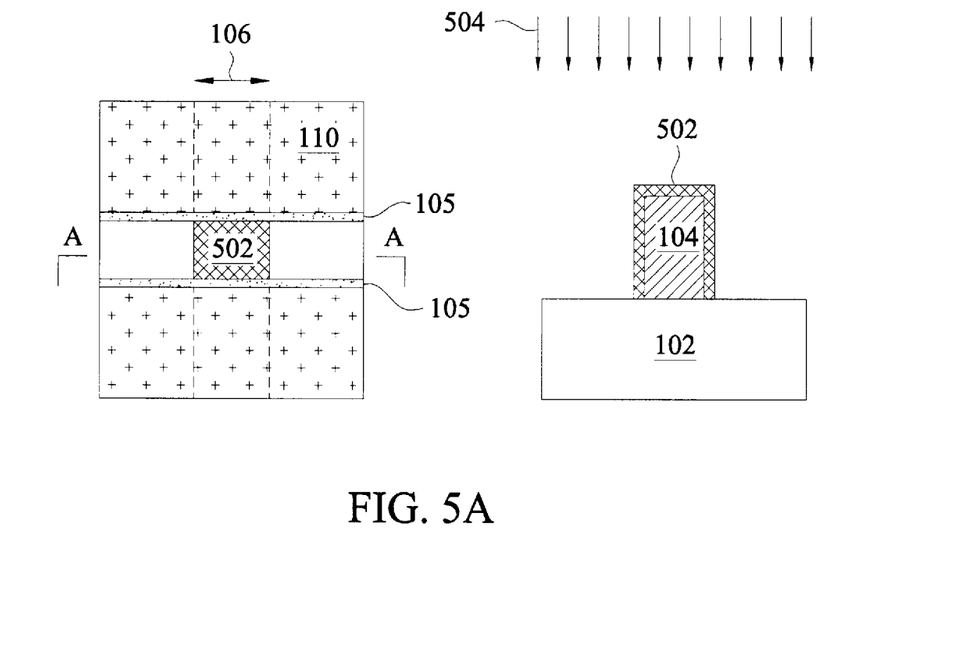
FIGS. 5A and 5B are diagrams showing a fin trimming process that includes an oxidation process, according to one example of principles described herein.
Figure 5B:
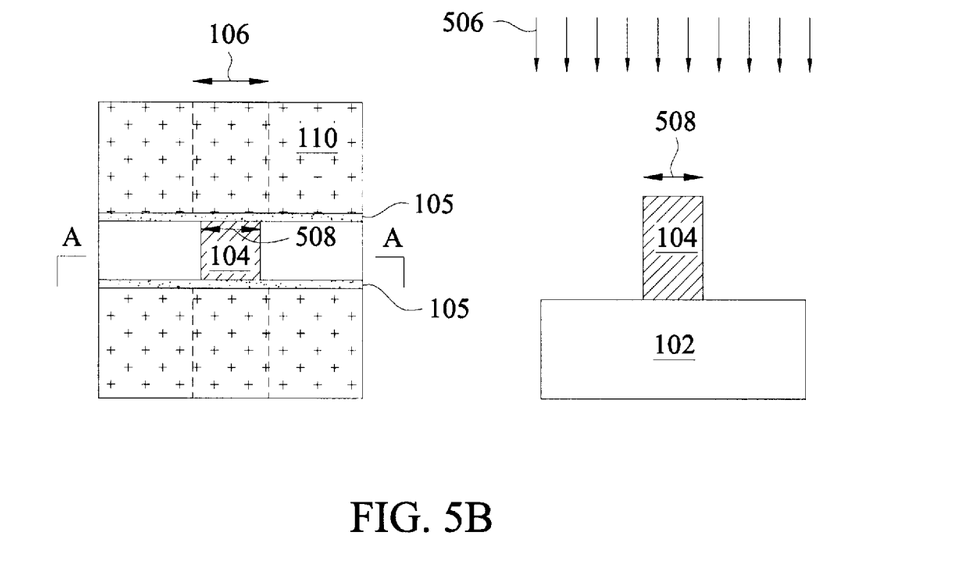

FIGS. 5A and 5B are diagrams showing a fin trimming process that includes an oxidation process. As described above, the fin structure 104 may be trimmed using an etching process such as a wet etching process. In some examples, the etching process may be improved through use of an oxidation process.

FIG. 5A illustrates application of an oxidation process 504 to form an oxide layer 502 around the fin structure 104. Specifically, the oxidation process 504 transforms the outer portions of the fin structure 104 into an oxide material layer 502. For example, if the fin structure 104 is made of silicon, then the oxide material layer 502 may be silicon oxide.

In some examples, the oxidation process 504 may be a chemical oxidation process. For example, the oxidation process 504 may involve application of a Sulfur Peroxide Mixture (SPM). The SPM may be applied at room temperature. The thickness of the oxide material layer 502 formed by the oxidation process 504 may be about 1 nanometer thick. In some examples, the thickness may be within a range of about 0.5 to 1.5 nanometers.

FIG. 5B illustrates a removal process 506 to remove the oxide material layer 502. Because the oxide material layer 502 was formed from the outer portions of the fin structure 104, removal of the oxide material layer 502 reduces the width of the fin structure 104. The removal process 506 may be an etching process. For example, the removal process 506 may be a wet etching process. Such etching process may be selective so as to remove the oxide material layer 502 while having a nominal impact on the semiconductor material of the fin structure 104. After the removal process 506, the fin structure 104 has a reduced width 508 at the exposed portion. In other words, the portions of the fin structure 104 underneath the gate spacers and the ILD layer 110 may have the original width 106.

Like the trimming processes described above, the oxidation process 504 and the removal process 506 may be applied only if the measured width is above a predefined threshold. Specifically, after a fabrication process is applied to form the fin structures 104 of a particular wafer, those fin structures may be measured using various measurement techniques. If the fin structure widths are below the predefined threshold, then no further trimming may be done. However, if the fin structure widths are above the predefined threshold, then a trimming process, such as the oxidation and removal processes described above may be performed.

Figure 6A:
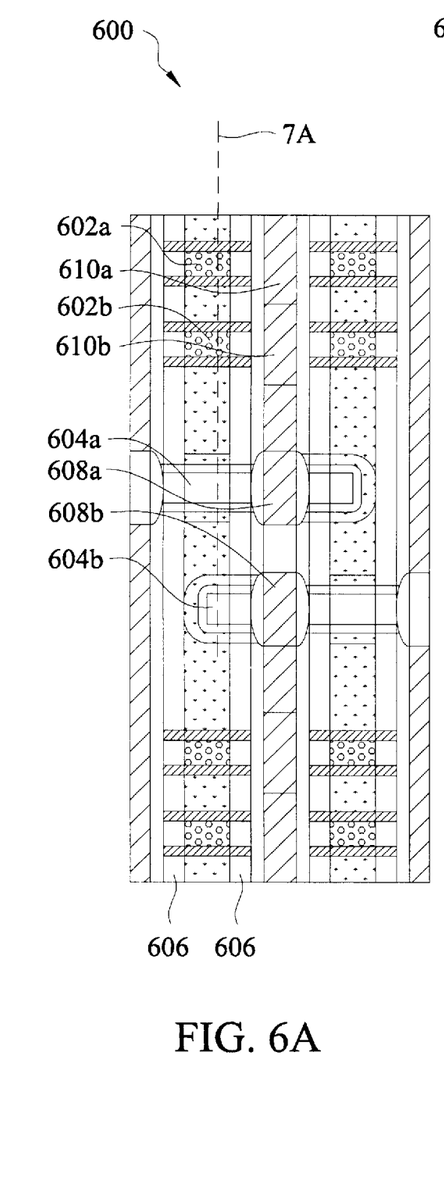
FIGS. 6A and 6B are diagrams showing a top view of a number of fin structures, according to one example of principles described herein.
Figure 6B:
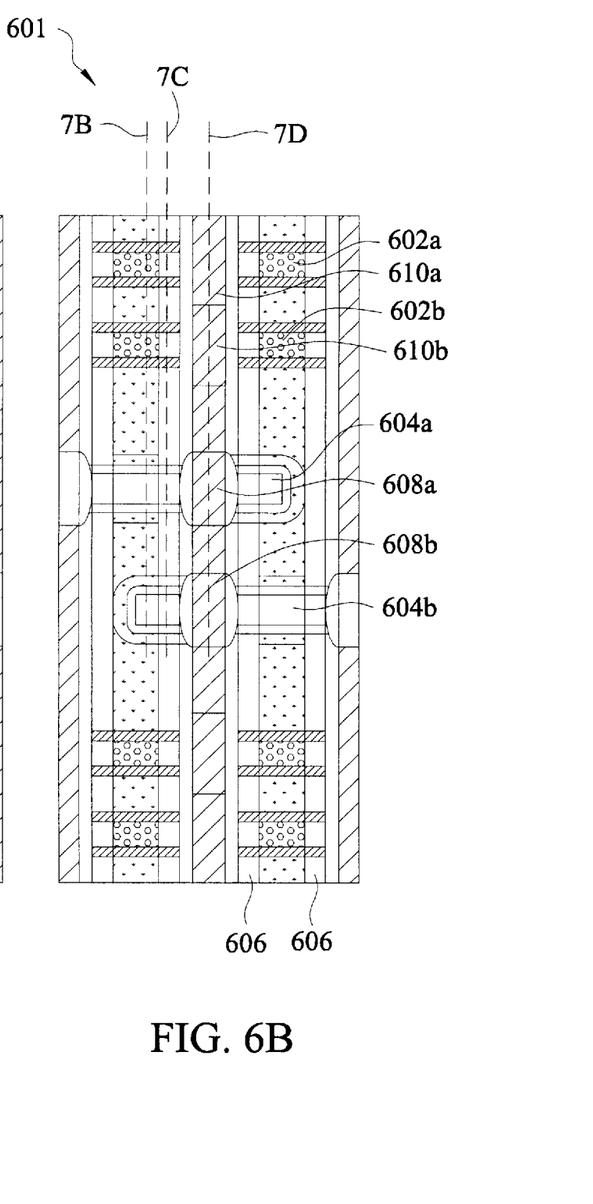

FIGS. 6A and 6B are diagrams showing a top view of a number of fin structures 602a, 602b, 604a, 604b that are associated with transistor devices. FIG. 6A illustrates a top view of the fin structures 602a, 602b, 604a, 604b after a dummy gate structure has been removed to expose the fin structures 602a, 602b, 604a, 604b and before a trimming process has been applied to reduce the width of the fin structures 602a, 602b, 604a, 604b. FIG. 6B illustrates a top view of the fin structures 602a, 602b, 604a, 604b after the fin trimming process has been applied to reduce the width of the exposed portions of the fin structures 602a, 602b, 604a, 604b.

The fin structures 602a, 602b, 604a, 604b may be formed in a manner similar to fin structure 104 as described above. According to the present example, fin structures 602a and 602b are associated with n-type transistors and fin structures 604a and 604b are associated with p-type transistors. With the dummy gate removed, portions of the fin structures 602a, 602b, 604a, 604b between the gate spacers 606 are exposed. The gate spacers 606 may be similar to the gate spacers 105 described above.

The fin structures 602a, 602b, 604a, 604b also include source/drain regions 610a, 610b, 608a, 608b. Specifically, the source/drain regions 610a, 610b are formed on fin structures 602a, 602b and are associated with the n-type transistors. Source/drain regions 608a, 608b are formed on fin structures 604a, 604b and are associated with the p-type transistors. The source/drain regions 608a, 608b, 610a, 610b may be similar to the source/drain regions 101 described above. Specifically, such regions 608a, 608b, 610a, 610b may be formed using epitaxial growth processes and may be doped in-situ to have the desired electrical properties.

Figure 7A:
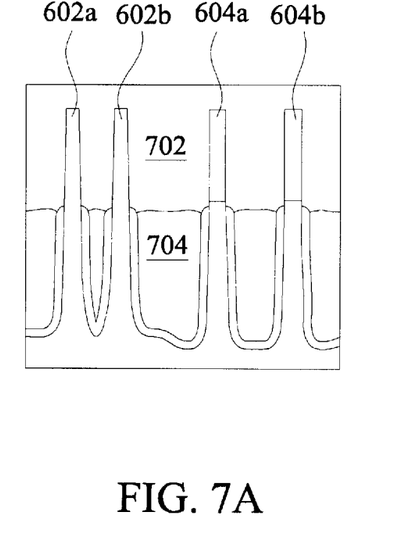
FIGS. 7A, 7B, 7C, and 7D are diagrams showing cross-sectional views of the devices shown in FIGS. 6A and 6B, according to one example of principles described herein.

FIGS. 7A, 7B, 7C, and 7D are diagrams showing cross-sectional views of the devices shown in FIGS. 6A and 6B. FIG. 7A illustrates a cross-sectional view (along line 7A of FIG. 6A) of fin structures 602a, 602b, 604a, 604b after the dummy gate structure has been removed and before a width of those fin structures 602a, 602b, 604a, 604b is trimmed. Thus, the fin structures 602a, 602b, 604a, 604b are exposed within space 702. In the present example, lower portions of the fin structures 602a, 602b, 604a, 604b are embedded within an STI region 704. Thus, the lower portions of the fin structures 602a, 602b, 604a, 604b will not be exposed to the fin with trimming process. In some examples, the fin structures 604a, 604b for the p-type transistors may be made of a different semiconductor material than the fin structures 602a, 602b for the n-type transistors. For example, the upper portions of fin structures 604a, 604b may be made of silicon germanium while the fin structures 602a, 602b may be made of silicon.

Figure 7B:
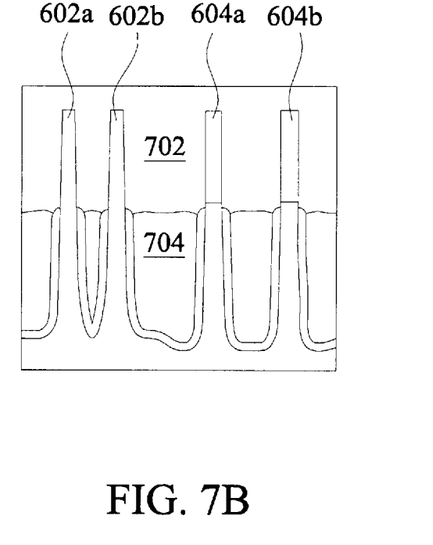

FIG. 7B illustrates a cross-sectional view (along line 7B of FIG. 6B) of the fin structures 602a, 602b, 604a, 604b after the fin trimming process has been applied. Thus, the fin structures 602a, 602b, 604a, 604b have a reduced width. Because only the upper portions of the fin structures 602a, 602b, 604a, 604b were exposed to the fin trimming process, the upper portions of the fin structures 602a, 602b, 604a, 604b have a trimmed width while the width of the lower portions of the fin structures 602a, 602b, 604a, 604b remains substantially the same.

Figure 7C:
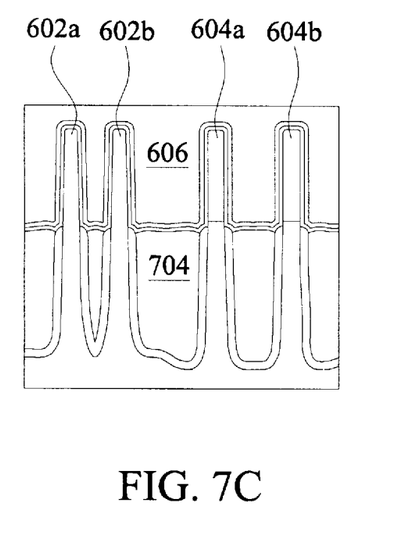

FIG. 7C illustrates a cross-sectional view (along line 7C of FIG. 6B) of the fin structures 602a, 602b, 604a, 604b under the gate spacer 606 after the fin trimming process has been applied. Because the gate structure 606 protects the fin structures 602a, 602b, 604a, 604b from the fin trimming process, the width of the fin structures 602a, 602b, 604a, 604b underneath the gate spacer 606 is similar to the width of the fin structures 602a, 602b, 604a, 604b before the fin trimming process is applied as illustrated in FIG. 7A.

Figure 7D:
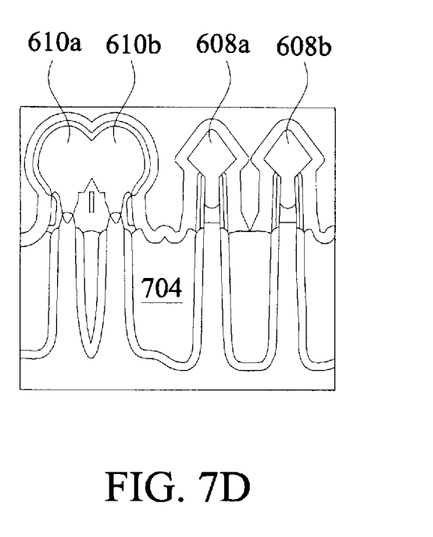

FIG. 7D illustrates a cross-sectional view (along line 7D of FIG. 6B) of the fin structures 602a, 602b, 604a, 604b where the source/drain regions 610a, 610b, 608a, 608b are formed. In the present example, the source/drain regions 610a, 610b for the n-type transistors are formed differently than the source/drain regions 608a, 608b for the p-type transistors. Specifically, the source/drain regions 610a, 610b are grown large enough so that they merge together. Conversely, source/drain regions 608a, 608b do not merge together. Source/drain regions 610a, 610b may be made of a different semiconductor material than source/drain regions 608a, 608b. Source/drain regions 610a, 610b may have different doping concentrations than source/drain regions 608a, 608b. Source/drain regions 610a, 610b may be strained or stressed differently than source/drain regions 608a, 608b. Because the portions of the fin structures 610a, 610b, 608a, 608b underneath the source/drain regions are not exposed to the fin trimming process, the width of such portions of the fin structures is not affected.

Figure 8:
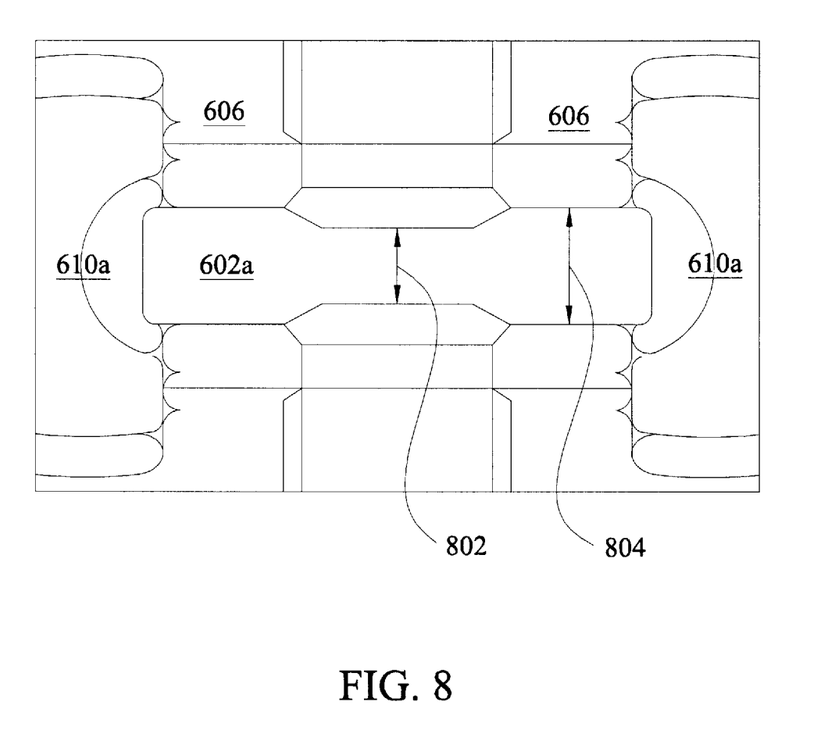
FIG. 8 is a diagram showing a top view of a device with a trimmed fin width, according to one example of principles described herein.

FIG. 8 is a diagram showing a top view of a device with a trimmed fin width. FIG. 8 illustrates a close up view of fin structure 602a. Fin structure 602a has a larger width 804 underneath the gate spacers 606 than the width 802 between the gate spacers 606. This gives the fin structure a "dumbbell" shape.

According to one example, a method includes forming a fin structure on a substrate, forming a dummy gate structure wrapped around the fin structure, measuring a width of the fin structure, depositing an Interlayer Dielectric (ILD) layer over the fin structure, removing the dummy gate structure, and in response to determining that the width exceeds a predetermined threshold, performing an etching process on an exposed portion of the fin structure to reduce a width of the exposed portion of the fin structure.

According to one example of principles described herein, a method includes forming a fin structure on a substrate, forming a dummy gate structure wrapped around the fin structure, depositing an Interlayer Dielectric (ILD) layer over the fin structure, removing the dummy gate structure to expose a portion of the fin structure, and performing an etching process on the portion of the fin structure to reduce a width of the portion of the fin structure.

According to one example, a semiconductor device includes a substrate, a fin structure disposed on the substrate, the fin structure having a first width. The device further includes a gate structure wrapped around the fin structure. The width of a portion of the fin structure between a first edge of the gate structure and a second edge of the gate structure has a second width that is smaller than the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin structure on a substrate;
forming a dummy gate wrapped around the fin structure;
depositing an interlayer dielectric (ILD) layer over the fin structure;
removing the dummy gate; and
after measuring a fin width of the fin structure and determining that the measured fin width exceeds a target fin width that defines a channel dimension for optimizing carrier mobility, wherein the target fin width exceeds a minimum fin width, performing an etching process on an exposed portion of the fin structure having the measured fin width to reduce a width of the exposed portion of the fin structure, such that the reduced fin width of the exposed portion of the fin structure is substantially the same as the target fin width after the performing of the etching process, wherein a difference between the reduced fin width and the minimum fin width is less than a difference between the measured fin width and the minimum fin width, wherein the fin structure is a first fin structure of a plurality of fin structures having a distribution of measured fin widths and reduced fin widths and wherein a distribution of the measured fin widths is wider than a distribution of the reduced fin widths.

2. The method of claim 1, wherein the target fin width is a first target fin width, wherein the minimum fin width defines a fin width prone to cause a defective fin structure, and wherein the first target fin width is less than or equal to a second target fin width that defines a fin width that ensures sufficient structural strength of the fin structure during processing.

3. The method of claim 1, further comprising, depositing a gate dielectric layer over the exposed portion of the fin structure and depositing a metal gate layer over the gate dielectric layer.

4. The method of claim 1, wherein the etching process reduces the width of the exposed portion of the fin structure to a width that ranges from about 0.5 nm less than the target fin width to about 0.5 nm greater than the target fin width.

5. The method of claim 1, further comprising applying the etching process for a period of time based in part on the measured fin width of the fin structure and the target fin width.

6. The method of claim 1, wherein the measuring the fin width of the fin structure includes using a scanning electron microscope (SEM) or transmission electron microscopy (TEM).

7. The method of claim 1, further comprising, before removing the dummy gate, forming source/drain regions within the fin structure, such that the dummy gate interposes the source/drain regions.

8. The method of claim 1, wherein after the etching process, a width of a portion of the fin structure gradually increases from the reduced fin width of the exposed portion of the fin structure to the measured width of an unexposed portion of the fin structure.

9. The method of claim 1, wherein the etching process is an isotropic etching process.

10. A method comprising:
forming a fin structure on a substrate;
forming a gate structure that includes a dummy gate and gate spacers disposed along sidewalls of the dummy gate, wherein the gate structure is wrapped around a channel region of the fin structure;
forming epitaxial source/drain features in source/drain regions of the fin structure, wherein the gate structure interposes the epitaxial source/drain features;
forming an interlayer dielectric (ILD) layer over the fin structure, the gate structure, and the epitaxial source/drain features;
removing the dummy gate of the gate structure to expose the channel region of the fin structure;
when, before trimming the fin structure, a width of the fin structure is less than or equal to a threshold channel width, forming a metal gate over the exposed channel region of the fin structure without trimming the fin structure; and
when the width of the fin structure is greater than the threshold channel width, trimming a width of the channel region of the fin structure before forming the metal gate over the exposed channel region of the fin structure, such that the width of the channel region after trimming is less than or equal to the threshold channel width.

11. The method of claim 10, further comprising measuring the width of the fin structure after forming the fin structure and before forming the gate structure.

12. The method of claim 10, wherein the threshold channel width is less than a threshold fin width for providing mechanical strength during processing.

13. The method of claim 10, wherein the trimming includes performing an oxidation process on the channel region of the fin structure to create an oxide material layer from outer portions of the channel region of the fin structure.

14. The method of claim 13, further comprising, after performing the oxidation process, applying an etching process to remove the oxide material layer.

15. The method of claim 10, wherein the trimming the width of the channel region of the fin structure includes removing less than or equal to about 5 nm from each side of the channel region of the fin structure.

16. The method of claim 10, wherein the trimming includes performing a wet etching process.

17. The method of claim 10, wherein gate spacers of the dummy gate structure remain after removing the dummy gate, such that a width of the fin structure underlying the gate spacers is not reduced.

18. A method for forming a semiconductor device comprising:
providing a substrate;
forming a fin structure having a first width on the substrate, wherein the first width ensures that the fin structure has sufficient mechanical strength for subsequent processing; and
when the first width is greater than a threshold channel width that optimizes carrier mobility in a channel region of the fin structure, performing a width reduction process on the channel region of the fin structure during a gate replacement process, such that source/drain regions of the fin structure have the first width and the channel region of the fin structure has a second width that is within a distribution range for the threshold channel width and greater than a minimum fin width, wherein a minimum width fin structure having the minimum fin width exceeds a tolerable risk of being defective, the channel region of the fin structure being disposed between the source/drain regions of the fin structure.

19. The method of claim 18, wherein the minimum fin width is a first value, the threshold channel width is a second value greater than the first value, and the distribution range is ±0.5 nm of the threshold channel width.

20. The method of claim 18, wherein the gate replacement process includes forming a gate dielectric over the channel region of the fin structure and forming a metal gate over the gate dielectric.

* * * * *